United States Patent
Cook

(10) Patent No.: US 7,192,875 B1
(45) Date of Patent: Mar. 20, 2007

(54) PROCESSES FOR TREATING MORPHOLOGICALLY-MODIFIED SILICON ELECTRODE SURFACES USING GAS-PHASE INTERHALOGENS

(75) Inventor: Joel M. Cook, Warrenton, VA (US)

(73) Assignee: Lam Research Corporation, Fremont, CA (US)

( * ) Notice: Subject to any disclaimer, the term of this patent is extended or adjusted under 35 U.S.C. 154(b) by 113 days.

(21) Appl. No.: 10/975,947

(22) Filed: Oct. 29, 2004

(51) Int. Cl.
H01L 21/302 (2006.01)

(52) U.S. Cl. .......................... 438/706; 216/58; 216/79; 438/707; 438/710; 438/719

(58) Field of Classification Search ............... 438/706, 438/707, 710, 719; 216/58, 79
See application file for complete search history.

(56) References Cited

U.S. PATENT DOCUMENTS

| | | | |
|---|---|---|---|
| 4,426,246 A | 1/1984 | Kravitz et al. | |
| 4,498,953 A | 2/1985 | Cook et al. | |
| 4,595,484 A | 6/1986 | Giammarco et al. | |
| 5,565,038 A | 10/1996 | Ashley | |
| 5,665,203 A | 9/1997 | Lee et al. | |
| 5,888,906 A | 3/1999 | Sandhu et al. | |
| 6,090,718 A | 7/2000 | Soga et al. | |
| 6,124,211 A | 9/2000 | Butterbaugh et al. | |
| 6,162,367 A | 12/2000 | Tai et al. | |
| 6,290,779 B1 | 9/2001 | Saleh et al. | |
| 6,391,788 B1 | 5/2002 | Khan et al. | |
| 6,489,249 B1 | 12/2002 | Mathad et al. | |
| 6,500,356 B2 | 12/2002 | Goto et al. | |
| 6,503,842 B2 | 1/2003 | Sandhu et al. | |
| 6,635,185 B2 | 10/2003 | Demmin et al. | |
| 6,730,600 B2 | 5/2004 | Layadi et al. | |
| 2003/0150476 A1* | 8/2003 | Suzuki ......................... 134/1 |
| 2003/0190814 A1 | 10/2003 | Kumar et al. | |

OTHER PUBLICATIONS

Ibbotson, D.E., et al. "Plasmaless dry etching of silicon with fluorine-containing compounds," J. Appl Phys 56 (10), Nov. 15, 1984, pp. 2939-2942.

Ibbotson, D.E., et al. "Selective interhalogen etching of tantalum compounds and other semiconductor materials," Appl. Phys. Lett. 46 (8), Apr. 15, 1985, pp. 794-796.

Yaws, Carl L., *The Matheson Gas Data Book*, 7th edition, McGraw-Hill (2001).

* cited by examiner

Primary Examiner—Zandra V. Smith
Assistant Examiner—Bac H. Au
(74) Attorney, Agent, or Firm—Buchanan Ingersoll & Rooney PC

(57) ABSTRACT

Processes for treating a morphologically-modified surface of a silicon upper electrode of a plasma processing chamber include exposing the surface to a gas composition containing at least one gas-phase halogen fluoride. The gas composition is effective to remove silicon from the morphologically-modified surface and restore the surface state.

27 Claims, 2 Drawing Sheets

PROCESSES FOR TREATING MORPHOLOGICALLY-MODIFIED SILICON ELECTRODE SURFACES USING GAS-PHASE INTERHALOGENS

BACKGROUND

Manufacturing processes that produce silicon integrated circuit devices include a sequence of steps that produce layers on semiconductor substrates by deposition steps and subsequently partially or completely by etching steps. A conventional dry etching procedure employs a plasma to convert a process gas into a mixture of neutral, reactive species and charged particles that material on a semiconductor substrate.

During plasma processing operations, interior surfaces of plasma processing chambers are exposed to the flux of energetic ions, photons and various neutral atoms and molecules that are generated by the plasma discharge, and to various reactions that occur in the processing of semiconductor substrates.

SUMMARY

Processes for treating a morphologically-modified, plasma-exposed surface of a silicon electrode for a plasma processing chamber are provided. A preferred embodiment of the processes comprises supplying a gas composition containing at least one gas-phase halogen fluoride into a chamber containing a silicon electrode that has a morphologically-modified, plasma-exposed surface. The morphologically-modified surface of the silicon electrode is subjected to the gas composition in the absence of plasma. That is, the process is performed without forming a plasma from the gas composition containing the at least one halogen fluoride, or from any other gas composition, in the processing chamber. The process is referred to herein as a "plasma-less" process. The gas composition is effective in removing silicon from the morphologically-modified electrode surface to thereby restore the surface.

The morphological modification of the surface of the silicon upper electrode can be evidenced by various phenomena, such as by the formation of a condition referred to as "black silicon," and is caused by plasma-related effects, such as ion bombardment and material deposition. In a preferred embodiment, the morphologically-modified surface of the silicon electrode is subjected to the gas composition for a sufficient amount of time to remove about a morphologically-modified depth of silicon from the surface. The removed material can include raised surface features, as well as depressed surface regions.

A preferred embodiment of a process for treating a morphologically-modified surface of a silicon electrode is provided, which comprises supplying a gas composition containing at least one gas-phase halogen fluoride into a capacitively-coupled plasma chamber containing a silicon upper electrode and a substrate support having a surface facing the upper electrode and on which a semiconductor substrate can be supported. The silicon electrode includes a plasma-exposed, morphologically-modified bottom surface. The bottom surface of the silicon electrode is subjected to the gas composition in the absence of plasma.

A preferred embodiment of a process for removing black silicon from a silicon electrode of a plasma processing chamber is provided, which comprises supplying a gas composition containing at least one gas-phase halogen fluoride into a capacitively-coupled plasma chamber containing a silicon upper electrode. The silicon electrode includes black silicon on its plasma-exposed, bottom surface. The bottom surface of the silicon electrode is subjected to the gas composition in the absence of plasma.

According to another preferred embodiment, prior to supplying the gas composition into the plasma processing chamber, plasma processing conditions in the plasma processing chamber that produce the morphological modification of the bottom surface of the silicon electrode are determined. The gas composition is preferably supplied into the plasma processing chamber no later than when the morphological changes are beginning to affect the process results on the semiconductor substrate. For example, the number of times a plasma process can be performed in the plasma processing chamber before a process shift occurs can be determined. Based on that information, the gas composition is preferably supplied into the plasma processing chamber before a process shift occurs.

BRIEF DESCRIPTION OF THE DRAWING FIGURES

DETAILED DESCRIPTION OF PREFERRED EMBODIMENTS

Parallel-plate plasma processing chambers, such as capacitively-coupled chambers, include an upper electrode having a bottom surface and a lower electrode. The bottom surface of the upper electrode typically faces an upper surface of a substrate support on which a semiconductor substrate is supported during processing operations. These types of plasma processing chambers are suitable for performing plasma etching processes of various materials, such as dielectric materials, on semiconductor substrates. During the plasma etching processes, an etching gas is supplied into the plasma processing chamber and a plasma is produced by applying power to the electrodes. The processing conditions are chosen so that the plasma etches desired features in materials provided on the semiconductor substrate.

Parallel-plate plasma processing chambers can include an upper electrode composed of silicon. It has been determined that under certain plasma processing conditions, the plasma-exposed bottom surface of the silicon upper electrode can be adversely affected by the flux of energetic ions, photons and various neutral atoms and molecules that are generated by the plasma discharge, and by various reactions that occur in the processing of semiconductor substrates. Consequently, the morphology of the plasma-exposed bottom surface of the silicon upper electrode can be changed. A morphological change of the bottom surface of the silicon upper electrode is characterized by a change in the topography of the bottom surface. The morphological change of the surface is caused by the non-uniform removal of material across the width (e.g., diameter) of the bottom surface, which results in different regions of the surface exhibiting their own distinct topographies.

Figure 1:
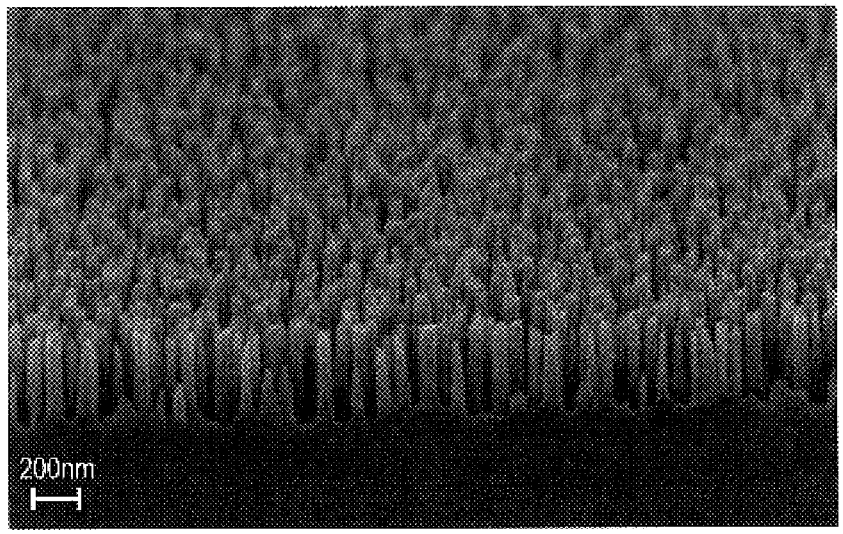
FIG. 1 is a micrograph showing the configuration of features of a morphologically-modified surface of a silicon electrode.

As another example, a silicon upper electrode surface morphology that is characterized by the presence of needle-like or rod-like micro features has been found to result from certain plasma etching processes and process conditions that are used in a plasma processing chamber containing the electrode. FIG. 1 shows a silicon upper electrode having a morphologically-modified, plasma-exposed bottom surface including these micro features. As shown, these micro features typically have a generally elongated, needle-like shape, and are closely spaced from each other. These micro features can typically have a length of from about 1 Å (0.001 µm) to about 5,000 Å (0.50 µm) or even greater. These micro features have been observed on silicon upper electrode surfaces following, for example, plasma etching processes of dielectric materials, such as low-k dielectric materials, in the chamber. The morphologically-modified surface can include one or more modified surface regions, e.g., a modified peripheral region and/or central region.

Herein, the depth of the morphological modification of the silicon upper electrode bottom surface, i.e., which can be equal to about the length of the micro features such as those as shown in FIG. 1, or the depth of topographically modified regions caused by other physical and/or chemical effects (e.g., ion bombardment and/or chemical reactions), is referred to as the "morphologically-modified depth" of the electrode.

Figure 2:
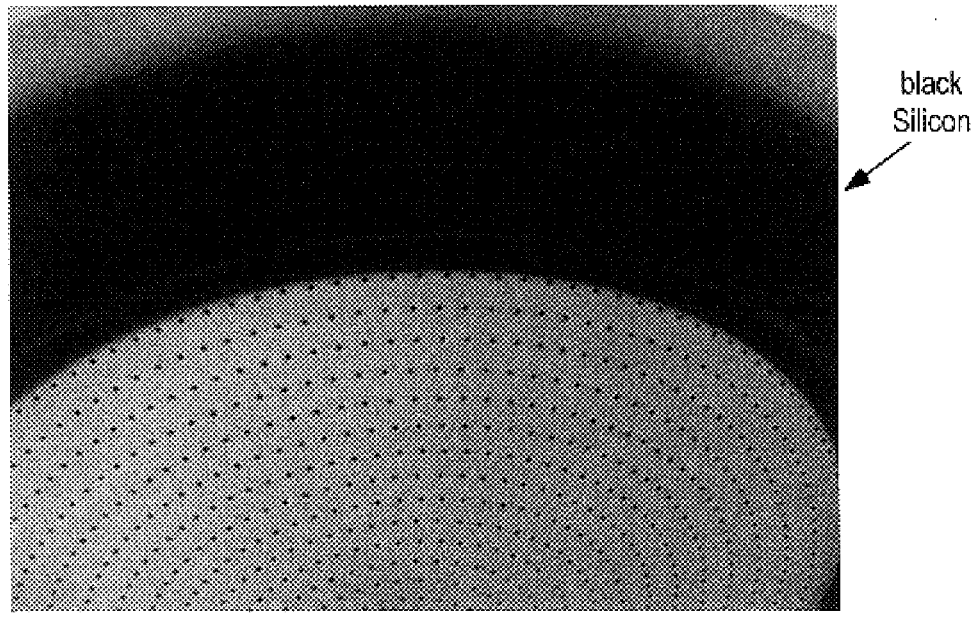
FIG. 2 depicts a morphologically-modified bottom surface of a silicon electrode.

One of the modified surface morphologies that has been observed to form on silicon upper electrode surfaces in plasma processing chambers is commonly referred to as "black silicon." "Black silicon" can form on a silicon surface as a result of micromasking of the surface by contaminants that have deposited on the surface during plasma processing operations. This micromasking can cause non-uniform etching of the electrode surface region and the consequent formation of closely-spaced, needle-like or rod-like micro features on the wafer surface, such as the micro features on the electrode surface shown in FIG. 1. These micro features can prevent light from reflecting from the modified regions of the silicon surface, which causes those regions to have a black appearance. FIG. 2 shows a portion of a bottom surface of a silicon upper electrode that includes a peripheral region at which "black silicon" has formed.

It has been determined that it is undesirable for black silicon to form on the plasma-exposed surface of an silicon upper electrode of a plasma processing chamber, such as a capacitively-coupled chamber, because black silicon formation increases the plasma-exposed surface area of the surface. When the extent of the black silicon formation becomes excessive, i.e., the modified surface area and/or the size of the features becomes excessive, the black silicon can cause a process shift due to an increased electrode surface area that alters the heterogeneous reaction occurring across the surface. Consequently, the plasma etching rate observed on the wafer can shift because the process chemistry changes. In addition, etching uniformity across the wafer can also be degraded by the excessive formation of black silicon.

As described above, the plasma-exposed, bottom surface of the silicon upper electrode also can be adversely affected by the flux of energetic ions, photons and various neutral atoms and molecules that are generated by the plasma discharge, and by various chemical reactions that occur in the processing of semiconductor substrates. Such plasma-induced damage and reactions can result in erosion and other associated morphological changes of the bottom surface of the silicon upper electrode.

In light of the above-described problems that can result from an excessive morphological change of a plasma-exposed bottom surface of a silicon upper electrode of a capacitively-coupled plasma processing chamber, such as can be caused by bombardment-related and reaction-related damage (e.g., excessive black silicon formation), it is desirable to prevent such morphological change from becoming excessive and adversely affecting plasma processing performance, i.e., causing a process shift in etching performance of semiconductor substrates. Such process shift can be manifested in a variation in the etching rate across individual semiconductor substrates (e.g., silicon wafers having layer stacks), and/or a variation in the etching rate between successively processed substrates of a lot of semiconductor substrates. Preferably, the surface state of the plasma-exposed bottom surface of the silicon upper electrode is maintained as close as possible to the state of the surface that existed prior to it being first exposed to plasma in the chamber.

Processes are provided for treating morphologically-modified surfaces of upper silicon electrodes for parallel-plate plasma processing chambers, such as capacitively-coupled chambers. The silicon electrode can be of single crystal silicon (doped or un-doped) or polycrystalline silicon. The morphologically-modified surfaces that can be treated by the processes include, but are not limited to, plasma-exposed surfaces that have been morphologically changed by exposure to plasma and chemical reactions, and on which black silicon-like formations are present.

Preferred embodiments of the processes comprise treating a plasma-exposed, morphologically-modified surface of a silicon upper electrode by exposing the surface to a gas composition in the absence of plasma in the chamber, i.e., without applying energy to the gas composition thus converting it into the plasma state or exposing the electrode to any other plasma in the chamber. The process is conducted in a chamber, which is preferably the plasma processing chamber in which the silicon upper electrode is mounted.

The gas composition preferably contains one or more halogen fluorides. Halogen fluorides are interhalogen compounds that are formed by reacting fluorine with another halogen and have the general formula $AF_n$, where n is typically 1, 3, 5 or 7 and A has a larger molecular weight than fluorine. Exemplary halogen fluorides that can be used in the processes include $ClF_3$, $BrF_3$, $IF_3$, $ClF_5$, $BrF_5$, $IF_5$, $IF_7$ and mixtures thereof. The halogen fluoride(s) are effective silicon-spontaneous etchants, and thus able to remove morphological (topographical) changes from the silicon and thereby restore the surface to a state that closely approximates the state which existed prior to the change. The silicon etching mechanism is postulated to involve dissociative chemisorption from a physisorbed layer.

The one or more halogen fluorides can optionally be combined with at least one inert gas, e.g., one or more rare gases, such as argon, helium or mixtures thereof, in order to achieve a sufficient total gas flow rate, halogen fluoride partial pressure and chamber pressure.

In preferred embodiments of the processes, the one or more halogen fluorides are entirely in the gas phase during etching of silicon, i.e., the halogen fluorides are not used to produce either a remote plasma or an in situ plasma in the plasma processing chamber. Preferred embodiments of the processes provide for dry etching of the morphologically-modified silicon electrode surface with one or more gas-phase halogen fluorides by "plasmaless" dry etching. Accordingly, preferred embodiments of the processes avoid ion bombardment of the silicon surface and other effects that typically prevail during plasma etching processes.

The gas-phase halogen fluorides are effective in etching the morphologically-modified silicon surface to remove the morphological change and restore the surface state to a desired state, preferably to a state that closely approximates that which existed prior to the electrode being exposed to plasma in the chamber. The etching of the silicon surface by the halogen fluoride(s) is preferably isotropic such that the etching occurs at substantially the same rate in all directions. The etching of the silicon surface by the halogen fluoride(s) is preferably also spontaneous.

Silicon oxides and nitrides are essentially not etched, or etched very slowly, by the halogen fluorides. Accordingly, gas-phase halogen fluorides can be used to remove rapidly silicon with very high selectivity over silicon nitride and the oxides of silicon. The halogen fluorides can be supplied into a plasma processing chamber containing these materials without concern that the materials may be adversely etched by the gases.

In a preferred embodiment, the bottom, morphologically-modified surface of the silicon upper electrode is exposed to a gas composition containing the halogen fluoride(s) by introducing the gas composition into a chamber containing the silicon upper electrode, preferably a capacitively-coupled plasma processing chamber. For example, the plasma processing chamber can be evacuated and then the desired gas composition introduced. In another preferred embodiment, the halogen fluoride(s) can be mixed with at least one inert gas and introduced into the chamber. The inert gas preferably does not substantially react with the halogen fluoride(s) and preferably also does not react with the silicon of the silicon upper electrode to retard the selectivity of the halogen fluoride(s).

Typically, the gas composition can have a pressure in the range of from about 500 mTorr to about 500 Torr. Increasing the interhalogen partial pressure increases the silicon etching rate. Preferably, the total gas flow of the gas composition is from about 50 sccm to about 300 sccm, with the halogen fluoride gas flow preferably being about 5% to about 25% of the total gas flow and the balance being inert gas flow.

In a preferred embodiment, etching of a morphologically-modified surface of a silicon upper electrode is continued for a sufficient amount of time to remove a desired thickness of silicon from the plasma-exposed surface of the electrode, e.g., about 200 nm to about 1000 nm. The desired thickness of silicon that is removed is preferably substantially equal to the depth of the morphological modified surface regions, e.g., equal to the length of black silicon features present at the morphologically-modified surface regions. As a result, the amount of silicon material removed from the upper electrode is minimized each time that the surface is treated. Typical etching rates of silicon for halogen fluoride partial pressures in the range from about 0.1 Torr to about 10 Torr are from about 50 Å/min to at least about 5000 Å/min, depending on the halogen fluoride species used. Therefore, over this range of silicon etch rates, etching times can range from about 10 minutes to about 1 minute, respectively, for removing features on the silicon upper electrode surface having a length of about 5000 Å, for example. In order to reduce the etching time, the gas composition and/or other conditions that provide a higher silicon etching rate can be used.

For example, during the etching of a silicon upper electrode surface with gas-phase halogen fluorides, the etching rate can be controlled by changing the silicon upper electrode temperature. During the exposure of the silicon electrode to the gas composition, the silicon upper electrode temperature is preferably from about ambient temperature to about 200° C., more preferably from about 100° C. to about 150° C. The temperature of the upper electrode can be controlled, for example, by activating heaters provided in the upper electrode assembly. An exemplary showerhead electrode assembly that includes at least one heater for heating the upper electrode is described in commonly-assigned U.S. patent application Ser. No. 10/743,062, which is incorporated herein by reference in its entirety. For example, during plasma processing operations, the silicon upper electrode can typically be maintained at an "idle" temperature, which may typically vary from about 130° C. to about 150° C. In a preferred embodiment, the silicon upper electrode is exposed to the gas-phase interhalogen(s) with the electrode at about the idle temperature.

As another example, the silicon upper electrode can be heated by generating a plasma in the chamber that is substantially non-reactive with the upper electrode prior to introducing the gas composition containing the halogen fluoride(s) into the chamber.

The silicon etching rate, R, for the halogen fluorides typically exhibits first-order kinetic dependence, i.e., R=[c]·k, where c is the concentration of the halogen fluoride and k is a rate constant. The rate constant has an Arrhenius form, i.e., k=A·exp(−E/RT), where E is the effective activation energy, R is the molar gas constant ($1.987 \times 10^{-3}$ kcal/deg·mol), and T is the substrate temperature (degrees Kelvin). $A = A_0 \cdot n \cdot T^{1/2}$, where $A_0$ is a pre-exponential factor, n the volume density ($cm^{-3}$) of reactant molecules and $T^{1/2}$ is a correction factor. Rearrangement gives a rate expression of the form: $R \cdot T^{1/2}/P = A_0 \cdot \exp(-E/RT)$. E can be derived by plotting the data on semi-log paper, or alternatively doing a non-linear fit. The etching rate as a function of temperature and pressure for each halogen fluoride system can be calculated. For example, the expression for etching silicon with $ClF_3$ is given by: $R = 1.54 \times 107 \cdot P \cdot T^{-1/2} \cdot \exp(-2063/T)$, which gives an etching rate of about 5100 Å/min for a $ClF_3$ pressure of 1 Torr and a silicon temperature of 140° C. As explained above, black silicon formations can typically have needle-like features with a length of about 2500 Å to about 5000 Å. Accordingly, this silicon etch rate with $ClF_3$ at such substrate temperature and gas pressure is suitable for etching black silicon. As explained above, It is desirable to minimize the etching time to avoid removing more silicon from the electrode than desired.

In another preferred embodiment, the silicon etch rate can be controlled by changing the pressure of the interhalogen, such as $ClF_3$, either as a pure gas or by diluting with an inert gas, such as argon, helium or the like. To the extent that the rate of the reaction between the silicon electrode and the interhalogen depends on the flux of the interhalogen, the amount of the interhalogen in the gas composition (i.e., the number concentration of the interhalogen) affects the silicon etch rate.

The halogen fluoride vapor pressure can be controlled in the process by, for example, using a heated gas delivery line and a mass flow controller for $ClF_3$ delivery, which controls the gas flow rate. The halogen fluoride vapor pressure is a function of temperature. Vapor pressures for the halogen fluorides as a function of temperature are provided in *The Matheson Gas Data Book*, seventh edition, by Carl L. Yaws, McGraw-Hill (2001), which is incorporated herein by reference in its entirety. At a temperature of 20° C., $ClF_3$ has a vapor pressure of about 7.5 psig. Generally, to control the vapor pressure of the halogen fluoride, the temperature of the container (e.g., a gas bottle) is controlled and the gas supply lines for supplying the gas to a chamber are heated to prevent condensation. Because $ClF_3$ boils at about 11° C., condensation is not expected to occur at normal ambient temperatures; however, by controlling the vapor pressure, condensation can be avoided.

As described above, embodiments of the processes for treating silicon surfaces are preferably performed before a process shift occurs in the plasma processing chamber due to an excessive morphological change of the plasma-exposed bottom surface of the silicon upper electrode. Accordingly, the silicon electrode is preferably treated with the gas-phase halogen fluoride at a frequency that is less than the interval in which such a process shift is predicted to occur for the process. The interval that is appropriate to preferably avoid a process shift can vary depending on the specific process that is being run in the plasma processing chamber, as well as the conditions used for that process.

It is undesirable to open a plasma processing chamber to examine visually the surface condition of the silicon electrode to determine whether an excessive morphological change has occurred on the electrode bottom surface. Particularly, it can typically require a period of hours to recover from the opening of the processing chamber. Preferably, the interval for performing the surface treating processes is determined by another approach, such as experimentally by processing multiple dummy and/or production wafers in a chamber using a selected process and process conditions and determining how many wafers can be processed before an undesirable process shift first occurs due to an excessive morphological change occurring on the plasma-exposed surface of the silicon upper electrode. This experimentally-determined information can then be applied to a production wafer process that uses the same process and process conditions to allow the silicon surface morphology to be restored before a process shift is predicted to occur. For example, if a process shift is experimentally found to occur after processing about twenty-five wafers using the same process and process conditions, then after processing no more than about twenty-five wafers, e.g., after processing 3, 5, 10, 15, 20 or 25 wafers, an embodiment of the silicon electrode etching process can be run to restore the silicon electrode surface to a desired state by removing morphological changes.

Furthermore, it is desirable to run a number of iterations in order to study the frequency of restorations required, the process impact, and whether it may be desirable to season the chamber after completing the treatment of the silicon upper electrode to remove morphological changes.

Figure 3:
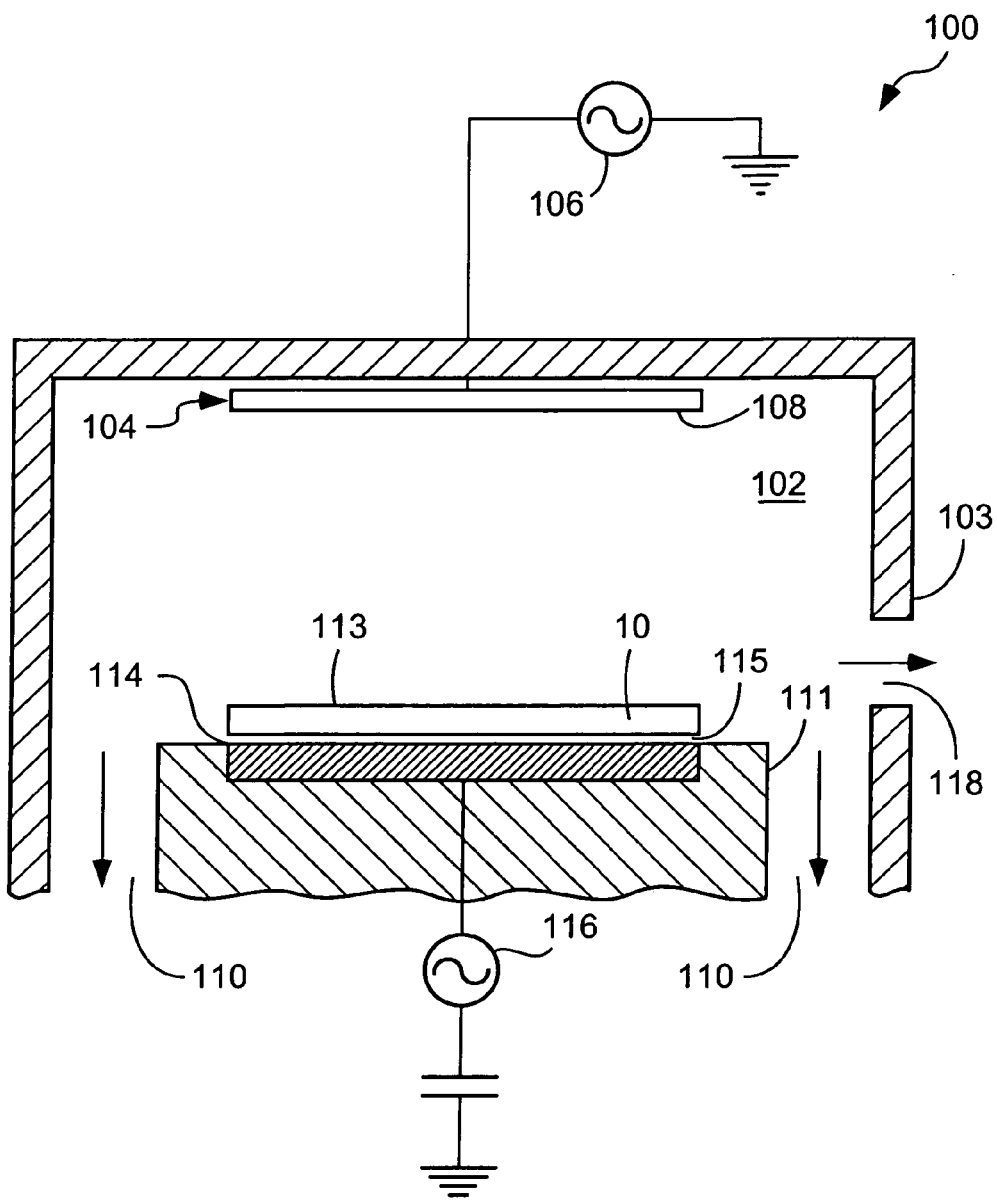
FIG. 3 depicts an exemplary parallel-plate plasma processing chamber in which preferred embodiments of the processes of treating morphologically-modified silicon electrodes can be practiced.

FIG. 3 illustrates an exemplary embodiment of a plasma processing apparatus 100 including a parallel-plate plasma processing chamber 102, such as a capacitively-coupled chamber, which can generate a medium-density plasma. The plasma processing chamber 102 includes a chamber wall 103. To provide an electrical path to ground, the chamber wall 103 can be made of aluminum or the like and electrically grounded. The plasma processing chamber 102 includes a wafer transfer slot 118 provided in the chamber wall 103 to transfer semiconductor substrates into and out of the plasma processing chamber 102.

The plasma processing chamber 102 includes an upper electrode 104 having a plasma-exposed bottom surface 108. The upper electrode 104 can be a showerhead electrode of an electrode assembly and include gas passages for distributing process gas into the plasma processing chamber. In such embodiments, the apparatus 100 includes a gas source (not shown) for supplying process gas to the upper electrode 104. Another gas source (not shown) is provided to supply the gas composition containing the gas-phase halogen fluoride(s) into the chamber. The gas composition can be introduced into the plasma processing chamber at any suitable location that provides for a sufficient fluorine concentration. The upper electrode 104 can be powered by an RF power source 106 via a matching network. In another embodiment, the upper electrode 104 can be grounded to provide a return path for power supplied by a bottom electrode of the plasma processing chamber 102.

In the embodiment of the apparatus 100 shown in FIG. 3, process gas is supplied into the plasma processing chamber 102 at the region between the upper electrode 104 and a semiconductor substrate 10 where plasma forms, e.g., a semiconductor wafer, supported on a substrate support 111. The substrate support 111 preferably includes an electrostatic chuck 114 that secures the semiconductor substrate 10 on the substrate support by an electrostatic clamping force. The electrostatic chuck 114 acts as a bottom electrode and is preferably biased by an RF power source 116 (typically via a matching network). The upper surface 115 of the electrostatic chuck 114 preferably has approximately the same diameter as the semiconductor substrate 10.

A pump (not shown) is adapted to maintain a desired vacuum pressure inside the plasma processing chamber 102. Gas is removed by the pump generally in the direction represented by arrows 110.

An exemplary parallel-plate plasma reactor that can be used is the dual-frequency plasma etch reactor described in commonly-assigned U.S. Pat. No. 6,090,304, which is hereby incorporated by reference in its entirety. In such reactors, etching gas can be supplied to a showerhead electrode from a gas supply and a capacitively-coupled plasma is generated in the reactor by supplying RF energy from one or more RF sources to the showerhead electrode and/or a bottom electrode, or the showerhead electrode can be electrically grounded and RF energy at two different frequencies can be supplied to the bottom electrode.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process for treating a morphologically-modified silicon surface of a silicon electrode for a plasma processing chamber, comprising:

supplying a gas composition containing at least one gas-phase halogen fluoride into a chamber containing a silicon electrode having a morphologically-modified silicon surface; and subjecting the morphologically-modified silicon surface of the silicon electrode to the gas composition in the absence of plasma to etch the morphologically-modified silicon surface.

2. The process of claim 1, wherein the morphologically-modified silicon surface of the silicon electrode includes elongated micro features of silicon.

3. The process of claim 1, wherein the gas composition is effective to etch isotropically the morphologically-modified silicon surface of the silicon electrode in the absence of plasma.

4. The process of claim 1, wherein the morphologically-modified silicon surface of the silicon electrode is subjected to the gas composition for an amount of time effective to remove about a morphologically-modified depth of the silicon from the silicon surface.

5. The process of claim 1, wherein the gas composition comprises at least one halogen fluoride selected from the group consisting of $ClF_3$, $BrF_3$, $BrF_5$ and $IF_5$.

6. The process of claim 1, wherein the gas composition comprises $ClF_3$.

7. The process of claim 1, wherein the silicon electrode is at a temperature of from about ambient temperature to about 200° C. when subjected to the gas composition.

8. The process of claim 1, wherein the silicon electrode is at a temperature of from about 100° C. to about 150° C. when subjected to the gas composition.

9. The process of claim 1, wherein the silicon electrode is of single crystal silicon or polysilicon.

10. The process of claim 1, wherein the chamber is at a pressure of from about 500 mTorr to about 500 Torr, and the gas composition is supplied at a flow rate of from about 50 sccm to about 300 sccm.

11. A process for treating a morphologically-modified silicon surface of a silicon electrode of a parallel-plate plasma processing chamber, comprising:
supplying a gas composition containing at least one gas-phase halogen fluoride into a parallel-plate plasma chamber containing a silicon upper electrode and a substrate support having a surface facing the upper electrode and on which a semiconductor substrate can be supported, the silicon electrode including a morphologically-modified silicon bottom surface; and
subjecting the silicon bottom surface of the silicon electrode to the gas composition in the absence of plasma to etch the morphologically-modified silicon bottom surface.

12. The process of claim 11, wherein the gas composition is effective to isotropically etch the silicon bottom surface of the silicon electrode to remove morphologically-modified silicon from the silicon bottom surface.

13. The process of claim 11, wherein the silicon bottom surface of the silicon electrode is subjected to the gas composition for an amount of time effective to remove about a morphologically-modified depth of the silicon from the silicon bottom surface.

14. The process of claim 11, wherein the gas-phase halogen fluoride is selected from the group consisting of $ClF_3$, $BrF_3$, $BrF_5$ and $IF_5$.

15. The process of claim 11, wherein the gas composition comprises $ClF_3$.

16. The process of claim 11, wherein the silicon electrode is at a temperature of from about ambient temperature to about 200° C. when subjected to the gas composition.

17. The process of claim 11, wherein the silicon electrode is at a temperature of from about 100° C. to about 150° C. when subjected to the gas composition.

18. The process of claim 11, wherein the silicon electrode is of single crystal silicon or polysilicon.

19. The process of claim 11, wherein the plasma processing chamber is at a pressure of from about 500 mT to about 500 Torr, and the gas composition is supplied at a flow rate of from about 50 sccm to about 300 sccm.

20. The process of claim 11, further comprising, prior to supplying the gas composition into the plasma processing chamber, determining plasma processing conditions in the plasma processing chamber that produce the morphological modification of the silicon bottom surface of the silicon electrode by exposing the silicon bottom surface to plasma, wherein the gas composition is supplied into the plasma processing chamber no later than when the plasma processing conditions are reached.

21. The process of claim 20, wherein the determining of the plasma processing conditions comprises determining the number of times a plasma etching process can be performed in the plasma processing chamber until a process shift occurs in the etching process, wherein the gas composition is supplied into the plasma processing chamber before a process shift occurs during the processing of semiconductor substrates in the chamber.

22. The process of claim 21, wherein the plasma process is a dielectric material etch process.

23. The process of claim 11, further comprising, prior to supplying the gas composition into the plasma processing chamber, evacuating the plasma processing chamber.

24. A process for removing black silicon from a silicon electrode of a capacitively-coupled plasma processing chamber, comprising;
supplying a gas composition containing at least one gas-phase halogen fluoride into a capacitively-coupled plasma chamber containing a silicon upper electrode, the silicon electrode including black silicon on a bottom surface thereof; and
subjecting the bottom surface of the silicon electrode to the gas composition in the absence of plasma to etch the black silicon.

25. The process of claim 24, wherein the bottom surface of the silicon electrode is subjected to the gas composition for an amount of time effective to remove about a morphologically-modified depth of the black silicon from the bottom surface.

26. The process of claim 24, wherein the gas-phase halogen fluoride is selected from the group consisting of $ClF_3$, $BrF_3$, $BrF_5$ and $IF_5$.

27. The process of claim 24, wherein the silicon electrode is at a temperature of from about ambient temperature to about 200° C. when subjected to the gas composition, the plasma processing chamber is at a pressure of from about 500 mT to about 500 Torr, and the gas composition is supplied at a flow rate of from about 50 sccm to about 300 sccm.

* * * * *